United States Patent
Trygstad

(10) Patent No.: US 10,175,661 B2
(45) Date of Patent: Jan. 8, 2019

(54) SYSTEM, METHOD AND APPARATUS FOR DETERMINING PROPERTIES OF PRODUCT OR PROCESS STREAMS

(71) Applicant: W. Marcus Trygstad, Spring, TX (US)

(72) Inventor: W. Marcus Trygstad, Spring, TX (US)

(73) Assignee: Yokogawa Corporation of America, Sugarland, TX (US)

( * ) Notice: Subject to any disclaimer, the term of this patent is extended or adjusted under 35 U.S.C. 154(b) by 414 days.

(21) Appl. No.: 14/173,301

(22) Filed: Feb. 5, 2014

(65) Prior Publication Data

US 2014/0309756 A1 Oct. 16, 2014

Related U.S. Application Data

(60) Provisional application No. 61/760,879, filed on Feb. 5, 2013.

(51) Int. Cl.
*G05B 13/04* (2006.01)
*G06F 17/50* (2006.01)

(52) U.S. Cl.
CPC ........... *G05B 13/04* (2013.01); *G05B 13/048* (2013.01); *G06F 17/5009* (2013.01)

(58) Field of Classification Search
None
See application file for complete search history.

(56) References Cited

U.S. PATENT DOCUMENTS

| 4,886,590 A | 12/1989 | Tittle |
| 5,260,865 A | 11/1993 | Beauford et al. |
| 5,402,333 A | 3/1995 | Cardner |

(Continued)

FOREIGN PATENT DOCUMENTS

| EP | 327 463 A1 | 6/2011 |
| JP | 10-082883 | 3/1998 |

(Continued)

OTHER PUBLICATIONS

Backx, T. et al., "integration of Model Predictive Control and Optimization of Processes", Aachen, Germany, Jan. 2000, pp. 2-13.

(Continued)

*Primary Examiner* — Tuan C Dao
(74) *Attorney, Agent, or Firm* — Davis Malm & D'Agostine, P.C.; Richard L. Sampson

(57) ABSTRACT

Systems, methods, and apparatuses are provided for determining properties of process streams, in particular, hydrocarbon processing streams. The systems, methods, and apparatuses frequently, for example, substantially in real-time, determine measurements for the properties of the process stream. The systems, methods, and apparatuses provide features that allow such properties of process streams to be accurately measured even as process conditions and other parameters that affect process operations change. More specifically, an analyzer having a measurement device configured to detect one or more independent variables of a process stream, a model configured to determine one or more analyzer measurements from the one or more independent variables, and a procedure to adjust the model using a corresponding primary measurement is disclosed.

50 Claims, 4 Drawing Sheets

(56) References Cited

U.S. PATENT DOCUMENTS

| | | | |
|---|---|---|---|
| 7,082,348 B1 | 7/2006 | Dahlquist et al. | |
| 8,005,645 B2 | 8/2011 | Emigholz et al. | |
| 8,036,760 B2 | 10/2011 | Mehta et al. | |
| 8,055,479 B2* | 11/2011 | Miller | G05B 23/024 702/189 |
| 2004/0140095 A1* | 7/2004 | Vinegar | E21B 36/008 166/302 |
| 2006/0178762 A1* | 8/2006 | Wroblewski | G05B 13/027 700/30 |
| 2008/0082302 A1* | 4/2008 | Samardzija | G05B 23/021 703/2 |
| 2009/0093892 A1* | 4/2009 | Kant | G05B 13/04 700/29 |
| 2009/0319070 A1* | 12/2009 | Morningred | G06Q 10/06 700/103 |
| 2010/0191361 A1 | 7/2010 | McCready et al. | |
| 2010/0204925 A1 | 8/2010 | Albahri | |
| 2010/0224365 A1 | 9/2010 | Abad | |
| 2010/0228485 A1 | 9/2010 | Betancourt et al. | |
| 2010/0230324 A1* | 9/2010 | Al-Alloush | B01J 29/80 208/82 |
| 2011/0276169 A1* | 11/2011 | Bourg, Jr. | G05B 19/41865 700/109 |
| 2012/0022670 A1 | 1/2012 | Boe et al. | |

FOREIGN PATENT DOCUMENTS

| | | |
|---|---|---|
| JP | A2007-531929 A | 11/2007 |
| JP | SPA2011-253275 A | 12/2011 |
| WO | WO2000/22489 | 4/2000 |
| WO | WO2001/59534 | 8/2001 |
| WO | 2005072465 A2 | 8/2005 |

OTHER PUBLICATIONS

Pearson, Ronald K., "Outliers in Process Modeling and Identification", IEEE Transactions on Control Systems Technology, New York, U.S., vol. 10, No. 1, pp. 55—Jan. 2002.

Supplementary European Search Report.

English Translation of Non-Final Office Action dated Feb. 5, 2018 from JPO for corresponding JP Application 2015-556250, Mailing No. 035726, 7 pages.

Murayama, Yasuhiko (Patent Attorney with Shiga Int'l Patent Office), English Translation of draft response prepared Mar. 19, 2018 to the Office Action in #1 above; 13 pages.

* cited by examiner

* NOT SHOWN: PROCESS CONTROL OUTPUTS FROM DCS TO THE PROCESS SYSTEM

SYSTEM, METHOD AND APPARATUS FOR DETERMINING PROPERTIES OF PRODUCT OR PROCESS STREAMS

RELATED APPLICATION

This application claims the benefit of U.S. Provisional Patent Application Ser. No. 61/760,879, entitled System, Method and Apparatus for Determining Properties of Product or Process Streams, filed on Feb. 5, 2013, the contents of which are incorporated herein by reference in their entirety for all purposes.

TECHNOLOGICAL FIELD

The present invention generally relates to a system, method, and apparatus of estimating properties of hydrocarbon streams. In particular, the systems, methods, and apparatuses of the present invention relate to measuring properties of hydrocarbon streams with high frequency and a high degree of accuracy.

BACKGROUND

The operations of process plants have been leveraged by the availability of analytical methods, for example, through the use of laboratory measurements or online analyzers. These types of results are valued by plant operations because they are typically regarded as reliable. For example, with respect to hydrocarbon and/or refining operations, primary analytical test methods provide a critical basis for custody transfer of products whose properties have been ascertained in accordance with industry standard test methods such as those developed and promulgated by ASTM International.

Notwithstanding the importance of these primary test methods, they do suffer from certain inadequacies. For example, laboratory measurements typically may be available only once or several times per day. Furthermore, several hours can elapse between the obtaining of a discrete sample and the reporting of results from tests performed on it, severely limiting the possibility to control the process on the basis of those results. Additionally, sample stability, sample contamination, issues of representative sampling, and uncertainty associated with the execution of test procedures may result in erroneous sample values being returned.

Improving the availability, integrity, and reproducibility of test data has in many cases motivated the on-line deployment of measurements. However, depending upon the type of measurement and analysis being performed, the cycle time for online analyzers may be on the order of ten or more minutes and, in some cases, up to and over one hour, which, in some cases, may still be inadequate for purposes of maximizing process efficiency or product quality.

Process industries have conventionally responded to the time delay issues and reliability of primary measurements by instituting secondary measurement techniques capable of predicting properties of certain process streams. Such secondary techniques commonly have included the use of some form of model, for example, multivariate statistical models capable of predicting certain properties of interest using process inputs, in which the properties of interest may be termed "dependent variables" and the process inputs may be termed "independent variables."

An important class of these model-based approaches is "Inferential analyzers," also referred to as "soft sensors" because they typically reside in software. Soft sensors are appealing for at least two reasons. First, many times they do not require the installation of additional sensors in the process unit because they typically rely upon measurements such as temperature, pressure, and flow rate, which may already be available. Second, with the advent of distributed control systems, the input measurements typically relied upon by soft sensors are substantially available in real-time, having discrete sampling rates of one second or even less. These advantages at least address the disadvantage of time delay associated with primary measurements by providing property predictions at intervals that are greater than those typically required by process control systems. Additionally, they obviate the need to physically obtain a sample, eliminating the issues of representative sampling and sample integrity.

While the fidelity of these models may be quite good over limited time periods ranging from a few hours to even perhaps a few days, conventional inferential analyzers tend to be insufficiently robust because in aggregate the independent variables that serve as inputs into the model typically relate to the chemistry of the process stream both indirectly and incompletely. They are indirect expressions of the chemistry to the extent that the readings of sensors on the process are functions of both process conditions and material in the process; they are incomplete insofar as the number of independent variables used in the models is fewer than the degrees of freedom in the system, which relate to both the process system and the material being processed through it. However, an exception may occur when steady-state or quasi-steady-state conditions prevail and many process and stream variables are nominally constant, e.g. when feed quality and the operation of the process system are substantially invariant. At such times, the independent variables may "determine" stream chemistry in the mathematical sense, and property predictions by an inferential analyzer may be extremely reliable. Yet, a fundamental issue is that models generally are correlative, and because correlation does not necessarily denote cause, inferential models may be largely empirical, with first principles having only distant influence. Indeed, the literature freely refers to the modeling approach that is perhaps most common as a "black box method." In summary, property predictions by inferential analyzers are labile to the extent that the effect (a predicted value) is removed from the primary cause (a stream property that ultimately is determined by sample chemistry).

The common practice therefore is to use periodic laboratory measurements to update the outputs from inferential analyzers to deal with a variety of variables. This strategy may improve the quality of inferential predictions across (i) the full range of possible feed qualities; (ii) changes in the condition of the process system, e.g. fouling; and (iii) changes in the response of sensors whose readings are the independent variables, e.g. those resulting from simple drift or from replacement of a faulty sensor with a new one. Nevertheless, issues attach to this approach which limit the possibilities for optimizing the performance of continuous processes, which may include maximizing throughput, adhering closely to product quality targets, minimizing energy usage, extending catalyst service life, and the like. A need remains in the art for improved model adaptation procedures, in particular, to accommodate variations in operating conditions resulting from, for example, changes in composition and properties of the feed; other process unit changes not within the scope of the model; sensor failure and/or discrepancy in process measurements; frequency of availability of laboratory analysis and/or measurements from analytical instruments for updating the model; and analyzer reliability.

Even small deviations in model accuracy can significantly impact the economies of production for large scale processes similar to those process units found in petroleum refineries and petrochemical plants. There remains a need in the art for improved methods of measuring properties of hydrocarbon streams, in particular, frequently, preferably on-line in substantially real-time. Furthermore, there remains a need in the art for improved methods of measuring properties of hydrocarbon streams with a high degree of accuracy.

BRIEF SUMMARY OF EXEMPLARY EMBODIMENTS

An aspect of the invention includes a system for determining a property of a process stream. The system includes a hard analyzer configured to measure one or more dependent variables associated with a sample of the process stream, where a dependent variable is also a property of the sample. An inferential analyzer includes a model of aspects of the process, and is configured to capture one or more independent process variables associated with the process stream and to use the independent process variables to generate one or more inferred dependent variables. A comparison module generates a comparison of the dependent variables measured by the hard analyzer and the dependent variables inferred by the inferential analyzer. The system uses the comparison to adjust one or more aspects of the model and/or adjust one or more inferred dependent variables and/or control the process stream.

Another aspect of the invention includes a method for determining a property of a process stream using the aforementioned system.

These embodiments of the invention and other aspects and embodiments of the invention will become apparent upon review of the following description taken in conjunction with the accompanying drawings. The invention, though, is pointed out with particularity by the appended claims.

BRIEF DESCRIPTION OF THE SEVERAL VIEWS OF THE DRAWING

Figure 1A:
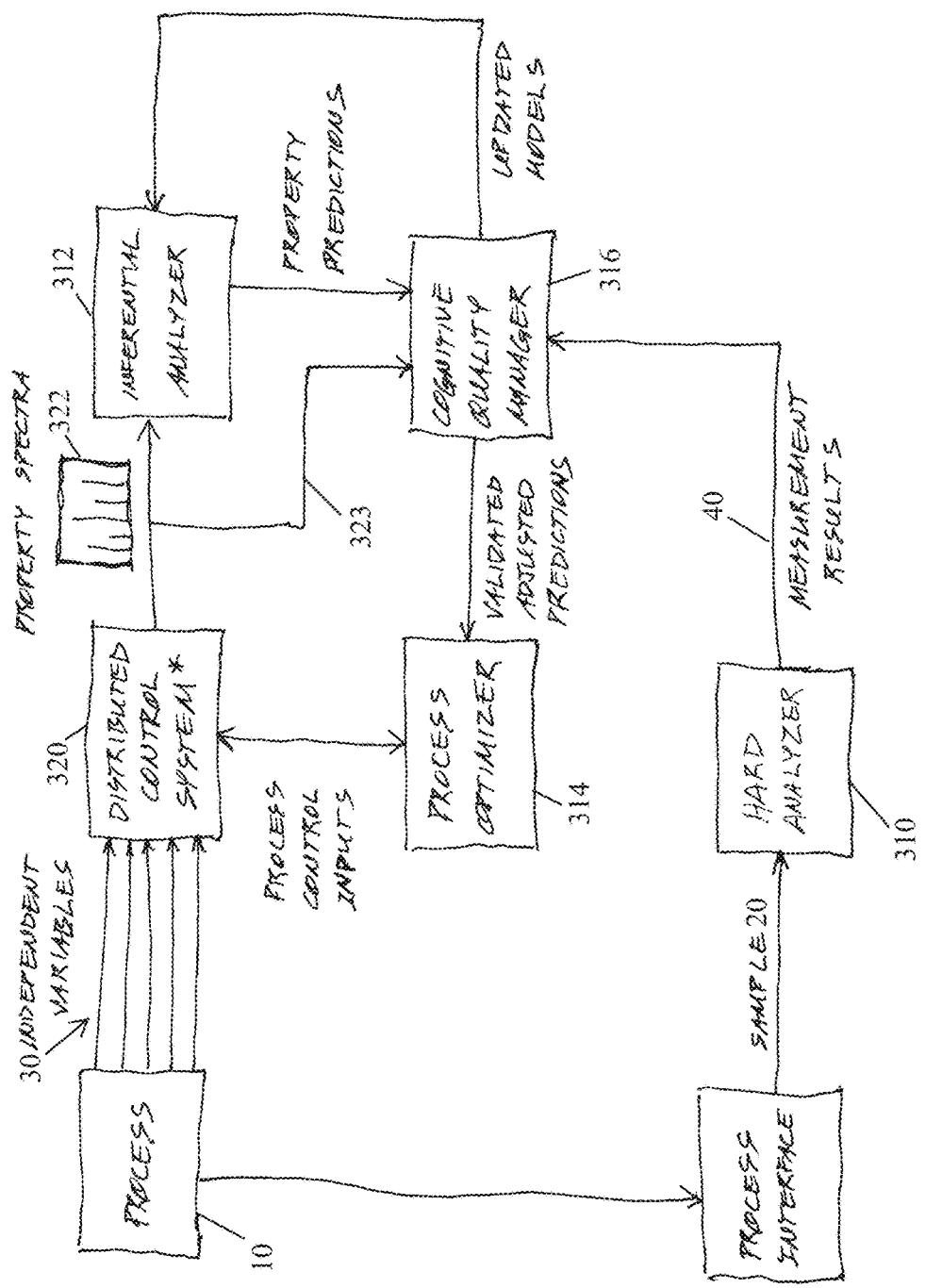
Figure 1B:
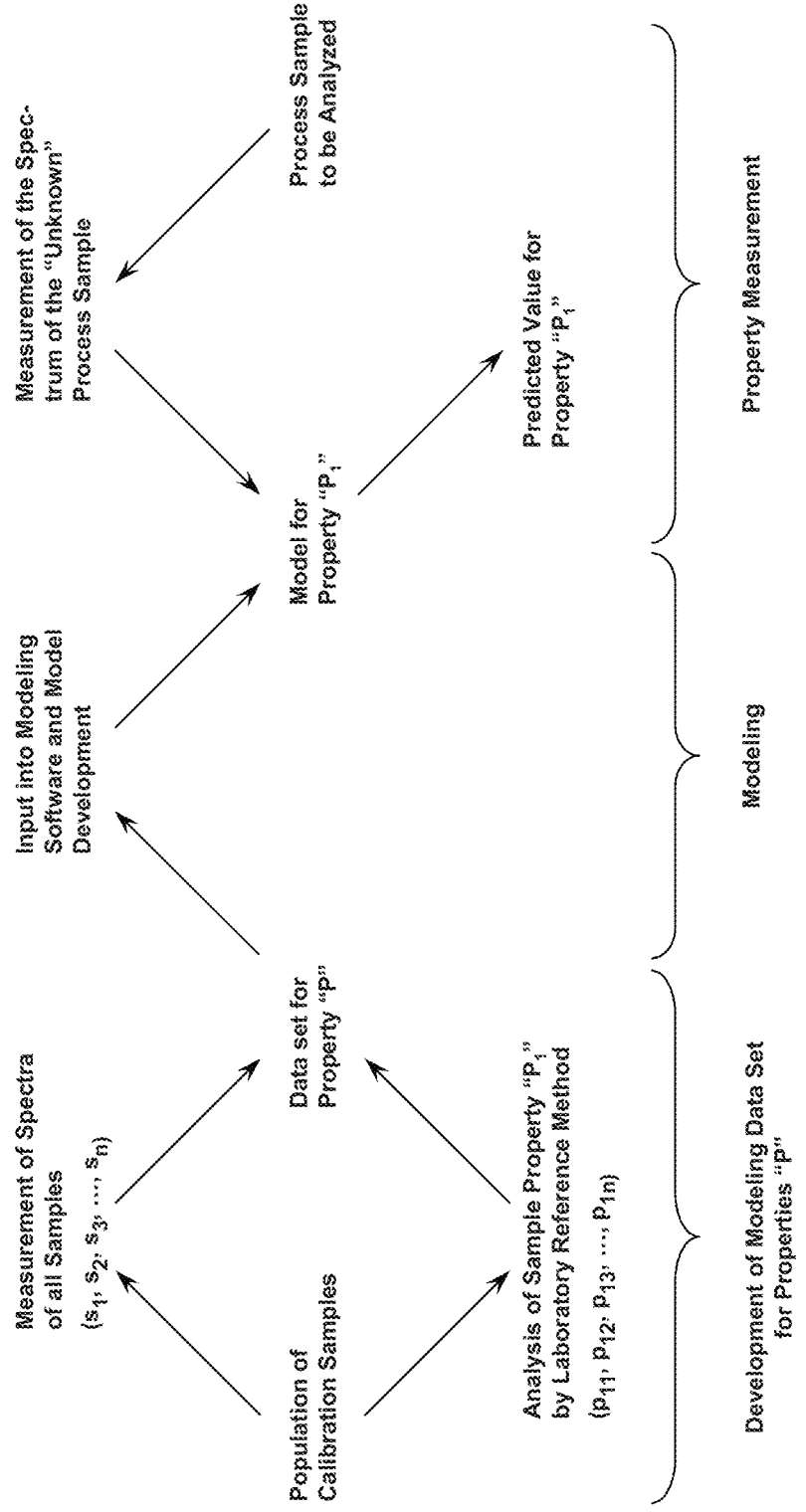
Figure 2:
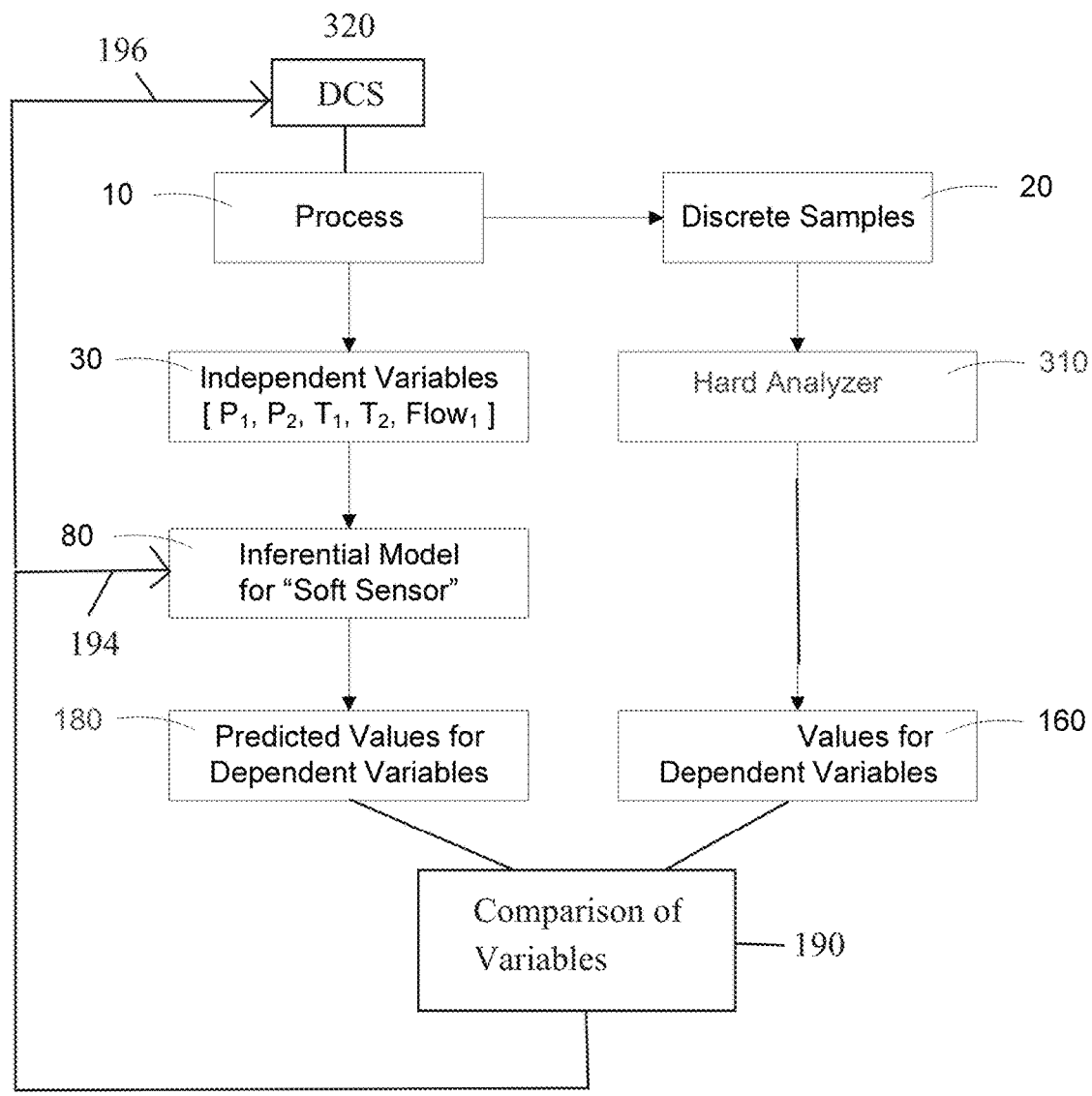
Figure 3:
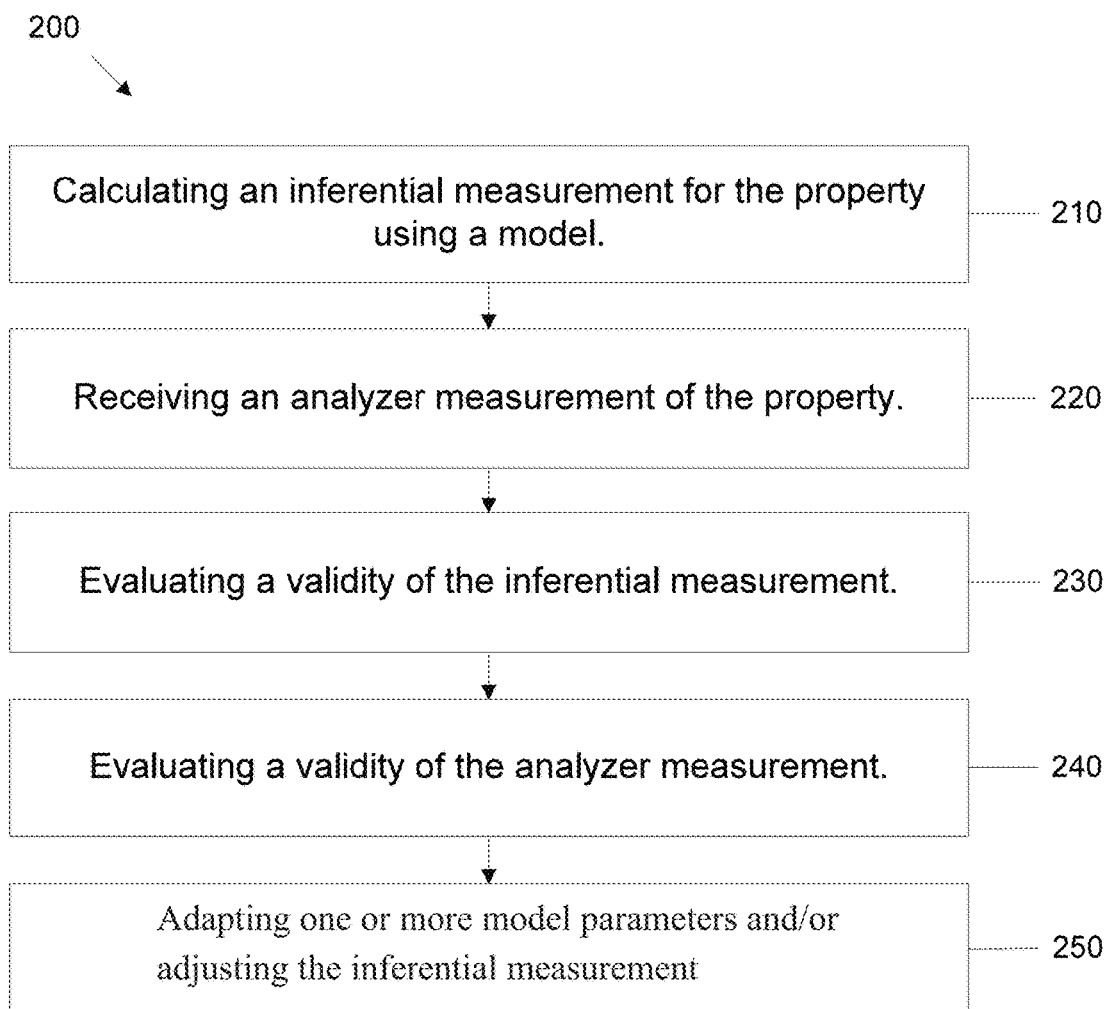

Having thus described the invention in general terms, reference will now be made to the accompanying drawing, and wherein:

FIG. 1A is a functional block diagram of an embodiment of the present invention;

FIG. 1B is a flowchart showing steps for model development and property prediction through application of a property model, that may be used with embodiments of the present invention;

FIG. 2 is a flowchart showing steps of predicting a property using a model-based soft analyzer, and updating the model in conjunction with a hard analyzer according to embodiment of the invention; and FIG. 3 is a flowchart showing steps of determining a property of a process stream according to an embodiment of the invention.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "an analyzer" includes a plurality of such analyzers. In another example, reference to "an analysis" includes a plurality of such analyses.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

As used herein, the term "hard analyzer" refers to an analyzer, including online or offline laboratory based devices, capable of substantially directly sensing and measuring a value for a particular property associated with a process stream and/or a sample of the process stream. These measured properties are referred to as "dependent variables." Examples of dependent variables may include concentrations of components in the sample and characteristics of the sample including "hot properties" such as flash point and distillation properties, or cold properties such as cloud point, freezing point, cold filter plugging point, and pour point of diesel. Examples of these analyzers include, respectively, the FPA-4, DPA-4, CPA-4, FRP-4, CFPP-4.2, and the PPA-4 available from Bartec Benke GmbH, Hamburg, Germany, while the GC8000 online GC by Yokogawa Electric Corporation may be used to perform a simulated distillation (simdist) analysis. The terms "primary measurement", "measurement", "property values", and "dependent variables" refer to the output of a hard analyzer. These measurements or dependent variables may be the result of a single analysis or the average of a plurality of analyses. As used herein, the terms "inferential analyzer" and "soft sensor" refer to a computer-implemented model-based analyzer that relies on various independent variables captured by sensors associated with a DCS (Distributed Control System), to infer values for various dependent variables of a process fluid. These inferred characteristics are also referred to as "predicted dependent variables", "inferential" or "model-based" measurements, "properties of interest", or simply "predictions". An example of an "inferential analyzer" that may be used in embodiments of the present invention includes the ExaRQE Robust Quality Estimator™ from Yokogawa Electric Corporation, Tokyo, Japan.

As used herein, a "process stream" or "process fluid" is any stream or fluid associated with a process. In non-limiting examples, process streams include any intermediate process stream of a process within a process plant. As used herein, a "product stream" or "product fluid" is a process stream that is the output from an operating unit within a production process and may be the feed to another operating unit or may substantially become the basis for a product produced by a process plant. However, a "product stream," which is a more limiting case of a process stream may still encompass process streams that may be subjected to further modification by other processing units or blending within a tank or a blender, for example, to provide the desired properties of the finished product. The methods and systems of the invention are intended to pertain to all process streams and all product streams, which may be a more limiting class of process streams. In certain embodiments, the methods and systems of the invention may be applied to the finished product itself.

The terms "computer" and "end-user device" are meant to encompass a workstation, personal computer, personal digital assistant (PDA), wireless telephone, or any other suitable computing device including a processor, a computer readable medium upon which computer readable program code (including instructions and/or data) may be disposed, and a user interface. The term 'real time' refers to sensing and responding to external events nearly simultaneously (e.g., within milliseconds or microseconds) with their occurrence, or sufficiently fast to enable the device to keep up with an external process. In the context of process control, the frequency of "real-time" data is defined in terms relative, not absolute. Thus, for a process in which significant changes can occur in time frames on the order of a few minutes, new analytical results that are available every half minute are, from the viewpoint of process control, real-time. So is a measurement time interval of 5 minutes when significant process variations occur in time frames longer than 10-15 minutes. For the purpose of optimizing operation of a refinery CDU (Crude Distillation Unit), an analysis results every 1-2 minutes are real time.

The terms "DCS" and "Distributed Control System" refer to a computer-implemented process control system such as the Centum VP™ commercially available from Yokogawa Electric Corporation, Tokyo, Japan.

The availability of information substantially in real-time for properties of process streams, such as continuous process streams in chemical and petrochemical processing, hydrocarbon processing, and refining operations may many times be important to maximizing throughput, controlling product quality, and/or ensuring that operations of the process plant are environmentally sound and safe.

The inventor has conceived of systems and methods for determining properties of process streams. In an embodiment of the invention, the process streams may be hydrocarbon process streams. In certain embodiments of the invention, the systems and methods of the invention may be used to determine a property or properties of a product stream. The systems and methods, according to certain embodiments of the invention, provide measurements frequently and with a high degree of accuracy.

The inventor has conceived of novel and unique methods and systems to integrate statistical models and statistical analysis/analyses with process models and process operations for determining a property or properties of a process stream. Certain embodiments of the invention are directed to determining a property or properties of a hydrocarbon process stream. Yet other embodiments of the invention are directed to determining a property or properties of a hydrocarbon product stream. Still yet other embodiments of the invention are directed to determining a property or properties of a finished hydrocarbon product.

In particular, the inventor has conceived of a system and method for combining two approaches to process operations and control by integrating one or more analyzers or methods of analysis with a process model for inferential analysis that is particularly suited to such one or more analyzers. Additionally, because, in certain embodiments of the invention, the process model may be selected specifically based upon the types of analyzer or analyzers being used, the inferential predictions may be adapted or tuned on the basis of less frequent, discrete measurement results from the one or more analyzers. Thus, the inventive system and method provides real-time prediction of results with a degree of accuracy that approaches that of the analytic measurements provided by the analyzer or analyzers whose measurement cycle times represent time frames that are substantially longer than real time.

In an embodiment of the invention, the primary measurement is provided by at least one hard analyzer. In a particular embodiment of the invention, the primary measurement is provided by at least one online hard analyzer, such as a GC. Without intending to be limiting, the system and method of the invention offers benefits associated with optimization of the associated chemical, petrochemical, and/or refinery process. For example, the number of primary measurements (dependent variables) provided by an online analyzer supports a methodology for adapting or tuning (i.e., adjusting) the predicted dependent variables provided by an inferential analyzer. According to certain embodiments of the invention, the adaptation or tuning procedure may be statistically improved relative to the conventional approaches by the relatively frequent capture and use of relatively numerous variables, for model adaptation or tuning.

Additionally, adaptation or tuning of the model using the procedures of the systems or methods of the invention is improved over the more conventional techniques of adjusting a bias or scaling factor that is applied to the estimated value. The more frequent feedback, for greater numbers of variables, for example, provided by an online analyzer or online analyzers enhance statistical certainty of the correction of the model due to the larger number of primary test results available over a period of time.

In addition, a multiple number of measurement values returned by the online analyzer may be compared using, for example, statistical techniques to determine whether any number of the values should be discarded. I.e., if a value falls outside of a statistically defined range, the values may be discarded preventing incorrect adaptation or tuning of the model from being performed.

In an embodiment of the invention, a statistical analysis or statistical diagnostic procedure is performed on the hard analyzer value and associated inferential value to determine the validity or invalidity of any one or more of the hard analyzer measurements and the inferential measurements. In some embodiments of the invention, when the hard analyzer measurement is determined to be invalid, then the model for the inferential measurement will not be updated using the hard analyzer measurement. In certain embodiments of the invention, the model adaptation or tuning procedure may be configured to wait for the return of a valid analyzer measurement or to use one or more previous valid analyzer measurements for model adaptation or tuning.

With respect to the inferential measurement, it may be more appropriate to say that evaluating the validity of the inferential measurement is a validation of such inferential measurement. Under normal circumstances, according to an embodiment of the invention, model adaptation or tuning may be performed to increase the accuracy of the inferential model.

In certain embodiments of the invention, a valid hard analyzer measurement or even a series of valid hard analyzer measurements may be held for subsequent use in model adaptation or tuning. In certain embodiments of the invention, the procedure for using previous valid hard analyzer measurement or measurements for model adaptation and/or tuning will consider the age of such valid hard analyzer measurements and/or whether the operation of the process is compatible with the use of such values in adapting or tuning the model to provide improved inferential measurements In an embodiment of the invention, a validation procedure for the inferential measurement may involve a procedure as further described herein that uses the most recent inferential measurement(s). Further pursuant to this embodiment, the plurality of inferential measurement data points may have been collected over a period of at most about 2 minutes, at most about 5 minutes, at most about 10 minutes, at most about 12 minutes, at most about 15 minutes, at most about 20 minutes, at most about 24 minutes, at most about 30 minutes, at most about 40 minutes, at most about 45 minutes, at most about 60 minutes, at most about 90 minutes, at most about 120 minutes, at most about 150 minutes, at most about 3 hours, at most about 4 hours, at most about 5 hours, at most about 6 hours at most about 7 hours, at most about 8 hours, at most about 10 hours, at most about 12 hours, at most about 18 hours, at most bout 1 day, at most about 2 days, or at most about 1 week.

Even further pursuant to the embodiment where a plurality of inferential measurement data points are collected, such data points may be collected on a substantially fixed, discrete interval. In certain embodiments of the invention, the substantially fixed, discrete interval for collecting the inferential measurement data points for use in the validation procedures may be about 1 second, about 2 seconds, about 5 seconds, about 6 seconds, about 10 seconds, about 12 seconds, about 15 seconds, about 20 seconds, about 24 seconds, about 30 seconds, about 40 seconds, about 45 seconds, about 1 minute, about 90 seconds, about 2 minutes, about 150 seconds, about 3 minutes, about 4 minutes, about 5 minutes about 6 minutes, about 10 minutes, about 12 minutes about 15 minutes, about 20 minutes, about 24 minutes, about 30 minutes, about 45 minutes, about 1 hour, or about 2 hours.

In certain embodiments of the invention, any one or more of the independent variables used to calculate an inferential measurement may be evaluated to determine a validity of the inferential measurement. For example, the evaluation of these independent variables may be used instead of or in addition to the most recent inferential measurement or a plurality of inferential measurement data points as further described herein. Similarly the most recent value of any of these independent variables may be used or a plurality of measurement data points of any of these independent variables may be used in determining a validity of the inferential measurement. Pursuant to the embodiments of the invention involving a plurality of measurement data points of any of these one or more independent variables such plurality of measurement data points may be collected over a period and a substantially fixed, discrete time interval similar to the range of periods and fixed discrete time intervals further described herein for the inferential measurement.

In an embodiment of the invention, a validation procedure for the hard analyzer measurement may involve a procedure as further described herein that uses the most recent hard analyzer measurement(s). Further pursuant to this embodiment, the plurality of inferential measurement data points may have been collected over a period of at most about 5 minutes, at most about 10 minutes, at most about 12 minutes, at most about 15 minutes, at most about 20 minutes, at most about 24 minutes, at most about 30 minutes, at most about 40 minutes, at most about 45 minutes, at most about 60 minutes, at most about 90 minutes, at most about 120 minutes, at most about 150 minutes, at most about 3 hours, at most about 4 hours, at most about 5 hours, at most about 6 hours at most about 7 hours, at most about 8 hours, at most about 10 hours, at most about 12 hours, at most about 18 hours, at most bout 1 day, at most about 2 days, or at most about 1 week.

In an embodiment of the invention, the primary measurement may be available at about every week, at about every day, at about every 12-hour shift, at about every 8-hour shift, at about every 4 hours, at about every 2 hours, at about every 1 hour, at about every 45 minutes, at about every 30 minutes, at about every 20 minutes, at about every 10 minutes, at about every 6 minutes, at about every 5 minutes, at about every 4 minutes, at about every 3 minutes, at about every 2 minutes, at about every 1 minute, at about every 30 seconds, at about every 15 seconds, at about every 10 seconds, at about every 5 seconds, or at about every 1 second.

In an embodiment of the invention, the primary measurement may be available at most about every week, at most about every day, at most about every 12-hour shift, at most about every 8-hour shift, at most about every 4 hours, at most about every 2 hours, at most about every 1 hour, at most about every 30 minutes, at most about every 20 minutes, at most about every 10 minutes, at most about every 6 minutes, at most about every 5 minutes, and at most about every 1 minute.

Even further pursuant to the embodiment wherein a plurality of hard analyzer measurement data points are collected, such data points may be collected on a substantially fixed, discrete interval. In certain embodiments of the invention, the substantially fixed, discrete interval for collecting the inferential measurement data points for use in the validation procedures may be about 2 seconds, about 5 seconds, about 6 seconds, about 10 seconds, about 12 seconds, about 15 seconds, about 20 seconds, about 24 seconds, about 30 seconds, about 40 seconds, about 45 seconds, about 1 minute, about 90 seconds, about 2 minutes, about 150 seconds, about 3 minutes, about 4 minutes, about 5 minutes about 6 minutes, about 10 minutes, about 12 minutes about 15 minutes, about 20 minutes, about 24 minutes, about 30 minutes, about 45 minutes, about 1 hour, about 2 hours, about 4 hours, about 5 hours, about 6 hours, about 8 hours, about 12 hours, about 18 hours, about 1 day, or about 2 days.

In one embodiment of the invention, validation of the inferential measurement is performed using the most recent value of the hard analyzer measurement and comprises a comparison of the inferential measurement, without adaptation or tuning, to the hard analyzer measurement. In an embodiment of the invention, the validation procedure comprises a simple evaluation of "closeness" of the inferential measurement to the hard analyzer measurement. In certain embodiments of the invention, the validation procedure involves determination of the statistical deviation between the values and whether that deviation is statistical within the expected range of deviations that occur between these variables.

In another embodiment of the invention, a population of sample data for either one of or both of the inferential measurement and the analytical measurement may be used in the validation procedure. In certain embodiments of the invention, statistical values representative of the population—e.g., without limitation, median, mean, standard deviation, and/or variance—may be used in the validation procedure for the inferential measurement against the hard analyzer measurement.

In other embodiments of the invention, the validation procedure of the inferential measurement and even for the hard analyzer measurement involves a multivariate procedure. Further pursuant to these embodiments of the invention, the inferential measurement and the hard analyzer measurement are each examined and validated substantially independent of the performance of each of these variables according to the procedures further provided herein.

In an exemplary embodiment, provided merely for purposes of illustration without any intention of being limiting, an inferential model for predicting the 20 percent boiling temperature for diesel was developed using independent process variables, including two temperature variables, $T_1$ and $T_2$, from the process; two pressure variables, $P_1$ and $P_2$, measured from the process; and a flowrate, F, measured from the process, e.g., by sensors and supplied to DCS 320 (FIG. 1A). Thus, $T_1$, $T_2$, $P_1$, $P_2$, and F are the independent variables supplied to inferential analyzer 312 (FIG. 1A) for the inferential model prediction and are considered the multivariable space for the inferential model. These variables may become part of the multivariate statistical validation procedure for the inferential measurement. For example, these variables may be used by the inferential analyzer to generate various inferred dependent variables that may then be compared to the measurement results (dependent variables) generated by hard analyzer 310 (FIG. 1A). These measurement results, which may be based on a single sample or series of samples over a period of time, as further described herein, may be used in determining the validity of the inferential measurement. In more specific embodiments of the invention, the validation procedure analyzes the values of the independent variables supplied by DCS 320 to consider whether the model used by inferential analyzer 312 has been developed for that sample space. If the model has not been developed for that space, then the validation procedure for the inferential measurement may indicate that the inferential values for these measurements or series of measurements are not valid, for example.

It should be noted that hard analyzer measurements may involve a multivariate data array suitable for analysis. In a non-limiting example, a SimDist analysis by gas chromatography provides a gas chromatogram that itself is a multivariable data array. Such information may be further analyzed, as further provided herein, in determining the validity of the hard analyzer measurement. In yet other embodiments of the invention, a hard analyzer may produce more than one hard analyzer measurements. Further pursuant to these embodiments, the hard analyzer measurements themselves may be considered a multivariate data array useful for determining the validity of any of these more than one hard analyzer measurements.

In certain embodiments of the invention, a statistical process control procedure is used to monitor the running changes of any one of or all of the hard analyzer measurement or measurements and the inferential measurement or measurements and to determine whether certain of these values should be identified as invalid.

In certain other embodiments of the invention, other statistical procedures may be used to determine the validity of any one of or all of the hard analyzer measurement or measurements and the inferential measurement or measurements. For example, a statistical analysis may be used to establish an expected value for each measurement and based upon a comparison of the actual variability in the measure data versus the typically variability, a deviation from the expected means test may be used to determine whether a measurement is valid or not. Indeed, any statistical procedure known in the art may be used to determine the validity of any or even all of the measurement values.

In yet other embodiments of the invention, a goodness of fit test procedure may be used using, for example, Chi Square test statistics to determine whether the inferential measurement should be accepted or rejected. The hard analyzer measurement may similarly be subjected to a test procedure to determine whether a certain value should be accepted or rejected.

In an embodiment of the invention, a message/messages and/or a signal/signals is/are generated when any one or both of the inferential measurement and/or the hard analyzer measurement is/are determined to be invalid. For example the message or messages may be sent to an operator and/or to the DCS 320 for real time control of the process 10. In certain embodiments of the invention, the signal or signals may be integrated into other routines in determining the status and validity of those routines. In certain embodiments of the invention, the signal or signals may be used by a control procedure to determine whether control should continue on the hard analyzer measurement and/or the inferential measurement.

Traditionally, the art has not deployed a measurement from a hard analyzer when a comparable measurement is available from an inferential analyzer on a more frequent interval. When such an interval is about less than 30 minutes, the art has not recognized the benefits of deployment of the use of a primary measurement from a hard analyzer when a comparable inferential measurement is available.

In certain embodiments of the invention, the measurement generated by the hard analyzer may be a special sample measurement that is used in addition to or instead of a routinely taken primary measurement. In yet other embodiments of the invention, the measurement generated by the hard analyzer may be available on discontinuous sampling intervals. Pursuant to these embodiments, certain methods and systems of the invention may apply discretization techniques to process the discontinuously sampled measurements. In certain embodiments of the invention, a simple interpolation is used to discretize discontinuous sample intervals. In yet certain other embodiments of the invention, a first order model may be used to discretize discontinuous sample intervals. In still yet certain other embodiments of the invention, a second order model may be used to discretize discontinuous sample intervals. In still yet certain other embodiments of the invention, a high order model may be used to discretize discontinuous sample intervals.

In an embodiment, a system or method of the invention may use a technique to replace certain independent variables that are found to be invalid or unavailable. A primary measurement may be unavailable for any number of reasons. In a non-limiting example, the primary measurement may be unavailable because the hard analyzer and/or instrument or instrumentation used to provide the measurement is not functioning correctly, not functioning at all, or being serviced, for example. Any of the methods described herein for discretizing measurements over discontinuous sampling intervals may be used to replace certain primary measurements that are invalid or not available at a certain sampling interval. For example, any of a simple interpolation, a first order model, a second order model, or a higher order model may be used to replace certain primary measurements that are invalid or not available at a certain sampling interval.

In an embodiment of the invention, the model used to determine inferential measurements may be tuned using any one or more of a procedure for adjusting bias, a procedure for adjusting a ratio multiplier, and a statistical procedure for model adaptation or tuning. In an embodiment of the invention, the model adaptation or tuning procedure may operate on one or more model parameters. In another embodiment of the invention, the model adaptation or tuning procedure may operate on one or more predicted values. In yet another embodiment of the invention, the model adaptation or tuning procedure may operate on any combination of one or more model parameters and one or more predicted values.

In certain embodiments of the invention, statistical validation techniques are used to determine validity of the primary measurement and the inferential measurement. In certain other embodiments of the invention, other validation techniques may be used to determine the validity of the primary measurement and/or the inferential measurement. In certain non-limiting examples, simple high and low limit checking may be used to determine validity of the primary measurement and/or the inferential measurement. In another non-limiting example, status of a primary measurement or any one or more of the independent measurements used in the inferential estimation procedure may be used to determine the validity of the primary measurement and/or the inferential measurement. In an exemplary embodiment, a smart transmitter provides the status of any of the primary measurement and/or any of the independent measurements used in the inferential estimation procedure.

An embodiment of the invention is directed to determining ASTM properties of hydrocarbon streams. Non-limiting examples of such ASTM properties include, for example, flash point, initial boiling point, ten (10) percent boiling point, twenty (20) percent boiling point, fifty (50) percent boiling point, seventy (70) percent boiling point, ninety (90) percent boiling point, and final point.

Other embodiments of the invention are directed to determining properties typically provided by chromatographic analyzers. A non-limiting example of such chromatographic properties includes any typically measured distillation properties. In certain embodiments of the invention, chromatograph values determined in accordance with the systems and methods of the invention include concentrations of certain compounds in the process stream. Such compounds, in accordance with certain embodiments of the invention, may include paraffins, isoparaffins, olefins, naphthenes, and/or aromatics. When concentrations of all compounds of this exemplary embodiment are provided, the analysis is collectively referred to as "PIONA." When concentrations of all compounds of this exemplary embodiment, except isoparaffins, are provided, the analysis is collectively referred to as "PONA."

In certain embodiments, the invention may be directed to inferential analyzers using yet other primary test methods such as, for example, cold properties, which may include pour point and cloud point. In yet other embodiments, the invention may be directed to inferential analyzers using yet other primary test methods such as, for example, percent sulfur, initial boiling point(s) and final boiling point(s); flash point; total aromatics (or paraffins, isoparaffins, olefins, and/or naphthenes), for example, in naphtha feed to ethylene crackers. Indeed an inferential analyzer of the invention may be applied to any primary test method whether such methods are known or later invented.

In certain embodiments of the invention, inferential predictions of dependent variables may be made using independent variables that include any one or more of temperature, pressure, or flow rate. Certain embodiments of the invention are directed to providing inferential predictions of dependent variables that may include any or any number of density, viscosity, refractive index, conductivity, pH, and any combinations thereof. Indeed, any variable that can be measured, whether now or later developed, may be used as an independent variable for determining inferential predictions.

The methods and systems of the invention may be applied to any type of process including, but not limited to, refinery processes, hydrocarbon processes, and chemical processes. In certain embodiments, the methods and systems of the invention may be applied to continuous processes. In certain other embodiments, the methods and systems of the invention may be applied to batch processes. In yet certain other embodiments, the methods and systems of the invention may be applied to semi-batch processes. In still certain other embodiments, the methods and systems of the invention may be applied to any combination of continuous processes, batch processes, and semi-batch processes.

An aspect of the invention provides systems and methods in which a hard analyzer may measure the independent variables, such as any one or multiple combinations of pressure(s), temperature(s), and flow rate(s) that are used in an inferential model whereby the inferential model generates a prediction(s) of the composition of the process fluid/sample. Pursuant to this aspect of the invention, according to an embodiment of the invention, any or all of the procedure of the methods and systems of the invention as described herein may be used.

According certain embodiments of the invention, validation of both the independent variables and the composition of the samples may be provided, similar to any of the validation techniques as further described herein for inferential measurements and hard analyzer measurements. According some embodiments of the invention, validation of the predictions may be provided, similar to any of the validation techniques as further described herein for inferential measurements and hard analyzer measurements. Furthermore, in certain embodiments of the invention, a model provides an inferential, modeled, referenced, and secondary measurement of the laboratory measurement. In further embodiments of the invention, the model may be adapted or tuned using the procedures of the invention, as further described herein, based upon other comparative measurements, for example.

An embodiment of the invention includes a system having a hard analyzer configured to generate one or more corresponding dependent variables of a process sample. The system also includes an inferential analyzer configured to capture and use one or more independent variables, along with a model, to generate one or more inferential dependent variables that correspond to the dependent variables generated by the hard analyzer. The system is also configured to generate a comparison of the measured dependent variables to the inferred dependent variables, and to use the comparison to adapt one or more parameters of the model. In certain embodiments of the invention, discretization of the corresponding measurement may be performed according to the procedures provided herein.

Turning now to FIG. 1A, an exemplary embodiment of the present invention is shown and described. As shown, an enhanced process control system 300 is configured for enhancing the operation and performance of an inferential analyzer by means of one or more hard analyzers. System 300 includes a hard analyzer 310 that performs online capture and/or analysis of a sample of process stream 10.

Thus, as discussed hereinabove, the hard analyzer measures one or more dependent variables. The sample is thus a representation of the process stream which is bounded in terms both physical and temporal, e.g. it is the physical subset of the process stream corresponding to a particular point and time in the process. System 300 also includes an inferential analyzer 312 configured to receive various independent process variables, e.g., from a DCS (Distributed Control System) 320, and to use those process variables to predict the values of various properties (inferred dependent variables) of the process, using a model. The DCS 320 is configured to capture various independent process variables from process 10, for use in control and operation of the process 10. A CQM (Cognitive Quality Manager) 316 compares the dependent variables generated by the hard analyzer 310 with the inferred dependent variables generated by inferential analyzer 312, and uses the comparison to update the model used by the inferential analyzer 312 and/or adjust values for the inferred dependent variables which are then sent to a Process Optimizer 314. The CQM is thus a processor-enabled module configured to use the comparison to validate the property predictions received from inferential analyzer 312, and to then offer options for adjusting those predictions and/or updating the inferential models. The Process Optimizer 314 may receive predictions from the CQM 316 for one or more streams and stream properties, and then convert the validated, adjusted predictions into processing directives, such as adjusted process control inputs, which are sent to the DCS 320 for its control of the process 10. It should be recognized that the Process Optimizer 314 may receive inputs from sources other than the CQM 316, e.g. it may also receive and operate on independent process variables received directly from DCS 320. Examples of a Process Optimizer that may be used in embodiments of the present invention includes APC (Advanced Process Control) generally, which also may include MPC (Model Predictive Control) systems such as Exasmoc™ Multivariable Optimizing Control commercially available from Yokogawa Electric Corporation, Tokyo, Japan. The model may be generated in any conventional manner, e.g., based on (a) the application of first principles, (b) on a "black box" approach that is strictly empirical e.g. based on statistical or neural network algorithms, or (c) a combination of the first-principles and empirical approaches, and is an inferential model. A representative example of model generation suitable for use in embodiments hereof, is shown and described hereinbelow with respect to FIG. 1B.

Examples of the independent variables used in system 300, including both independent process variables and independent sample variables, may include but are not limited to temperature, pressure, the rate of addition or consumption of a catalyst or reagent, flow, the input (output) of thermal energy into (from) the process or a point in the process, refractive index, conductivity, viscosity, opacity, pH, density, intensity responses measured by photometric or spectrometric devices at particular wavelengths or frequencies, and the like.

Optionally, e.g., in order to facilitate the operation of the inferential analyzer 312 and/or CQM 316, the independent process variables may be organized by plotting their values (y-values) according to kind (source/origin or type) arrayed across the x-axis to form a property spectrum (also referred to as a sample spectrum or spectra) 322, in which the independent variables plotted in a given property spectrum are related to each other temporally, e.g. they were captured substantially at the same time. This sample spectrum 322 may then be used to update or generate the property model, so that the model is based on a population of sample spectra 322 and their corresponding property values (dependent variables).

Optionally, the sample spectrum 322 may be supplied directly to the CQM 316 as shown at 323, to enable the CQM to receive the property spectrum 322 in an "unprocessed" or unaltered state. And while a direct channel 323 may be used, it should be recognized that spectrum 322 may also be supplied in its unaltered state to the CQM 316 through the inferential analyzer 312, e.g., by tunneling through the analyzer 312.

A particular population of known sample spectra may also be used as a calibration sample set for the inferential model. The inferential analyzer 312 is thus configured to optionally predict a plurality of properties for a single stream or for a plurality of streams associated with said process, the predictions being based on one or more property spectra 322.

Exemplary methods used by process optimizer 314 to monitor/control/optimize process 10 may include one or more of: (a) multivariate method to determine whether the sample spectrum 322 belongs to the same population of sample spectra as a calibration sample set; (b) multivariate method to classify any spectral outlier according to cause; (c) replacing in the sample spectrum 322 of the false spectral outlier; (d) determining whether the outlier condition is due to a particular sensor by comparison to a baseline; (e) correcting the outlier condition by replacement with a model value; (f) comparing the inferred dependent variables with the dependent variables; (g) wherein the comparing (f) optionally includes averaging, regression, a damping function, or a vector-based algorithm, to provide a mathematical relationship between the inferred dependent variables and the dependent variables, which mathematical relationship is then applied to subsequent inferential predictions to produce a corrected inferential value; (h) estimating the lag time between values predicted by the inferential analyzer and those measured by a hard analyzer; (i) adjusting predictions from the inferential analyzer; (j) evaluating the difference between corresponding inferential and measured values using statistical analysis; (k) updating the model with the addition of recent data and the elimination of older data; (l) updating the model by adding sample data for spectral outliers and/or prediction outliers; (m) optionally capturing a sample that has been identified as a true spectral outlier or a property outlier, and using its property value(s) to adjust the outputs of the inferential analyzer; and (n) performing model updates on the basis of schedule, and/or on the basis of need as determined by factors including frequency and severity of spectral outliers and/or prediction outliers, changing of process operation or configuration. Each of the exemplary methods (a)-(n) will be described in greater detail as follows.

The method (a) may include determining the validity of a property prediction supplied by inferential analyzer 312, on the basis of one or more metrics which may be obtained by a multivariate method, e.g. the application to the sample spectrum of a multivariate model such as a PLS, PCR, or Principal Component Analysis (PCA) model based on the calibration sample set, which method and metrics are known to those skilled in the art of chemometric analysis, are capable of identifying if sample spectrum belongs to the same population of sample spectra in the calibration sample set, and which include but are not limited to the Mahalanobis distance, which is an expression of a sample's spatial relationship to the calibration sample set, or the spectral residual, which is a measure of how well a multivariate model accounts for all independent variables in a sample spectrum.

Method (b) may include further applying the multivariate method to classify any spectral outlier according to cause, e.g. whether an independent variable in the sample spectrum 322 is anomalous (e.g. because a sensor that is the source of an independent process variable is faulty), or alternatively if the sample spectrum 322 represents process conditions, sample chemistry, or a combination thereof which are distinctly different from those in the calibration sample set, these outliers being referred to, respectively, as false and true spectral outliers.

Method (c) may include inferring and replacing in the sample spectrum 322 of the false spectral outlier a value for the faulty independent variable by methods known to those skilled in the art of multivariate modeling methods (chemometrics), e.g. a method based on Principle Component Analysis (PCA), to permit the reliable prediction of the dependent variable (the sample property) by the inferential analyzer.

Method (d) may include determining if the outlier condition is because the response function of a sensor that is the source of an independent process variable has changed compared with the response function for the same independent process variable when property spectra in the calibration sample set were recorded, where the change may be due to aging, fouling, calibration drift, or the replacement of a faulty sensor with a different sensor whose response function is not identical to that of the sensor used to generate property spectra in the calibration sample set, and where the change may be characterized by a mathematical function known to those skilled in the art, e.g. a simple linear equation involving slope and/or offset, or a second order equation, a multivariable function based on PCA, and the like.

Method (e) may include correcting the changed sensor readings by determining the mathematical function on the basis of values that are inferred by means of the aforementioned multivariate modeling methods and also responses of the sensor that are independent process variables in outlier sample spectra.

Method (f) may include evaluating the performance of the inferential analyzer by the comparing of property values predicted by application of a property model to a sample spectrum with property values for corresponding samples measured by the hard analyzer 310, where the comparison is the application of suitable statistical methods known to those skilled in the art of statistical analysis, e.g. those based on the calculation of the difference between one predicted value and the corresponding measured value or between averages based on predicted and/or measured values obtained in a relatively short time interval. It is noted that the frequency of property predictions by the inferential analyzer is relatively high compared with that for measurements by hard analyzers, e.g. 6 $min^{-1}$ to 60 $min^{-1}$ versus 1 $hr^{-1}$ to 20 $hr^{-1}$, respectively.

Method (g) may include optionally performing the comparison by relating a population of values (inferred dependent variables) predicted by the inferential analyzer 312 and a population of corresponding values (dependent variables) measured by the hard analyzer 310, where the populations correspond to predictions and measurements made in time frames ranging from that of the hard analyzer's measurement cycle time to about a few hours or a few days, and where the relating is by performing on each of the populations a suitable calculation known to those skilled in the art such as one based on averaging, regression, a damping function, or a vector-based algorithm, and where the calculation yields separate results for the inferential and measured values, that for the former being mathematically related to that for the latter, e.g. as a bias, a first order linear equation or a second order polynomial, and the like, which mathematical relationship is then applied to subsequent inferential predictions, and which application produces a corrected inferential value.

Method (h) may include dynamically estimating the lag time between values predicted by the inferential analyzer and those measured by a hard analyzer by methodologies known to those skilled in multivariate statistical methods, e.g. by minimizing variance in a plot of predicted values versus measured values by iteratively advancing the times for a population of measured values relative to the times of a population of predicted values. For example, in the case of diesel rundown from a CDU, changes in the independent variables P/T/flow, substantially describe in real time the changes occurring at the points in the process where those properties are being measured, whereas the manifestation of those changes in the diesel rundown stream, e.g. in values for the dependent variables $T_{20}$ and $T_{90}$, may lag for a relatively long periods of time ranging from perhaps 15 minutes to 30 minutes. $T_{20}$ and $T_{90}$ are the temperatures at which 20% and 90% of the components in a sample distill off the sample, respectively. Therefore, a temporal reconciliation is necessary to ensure that property values measured by a hard analyzer are properly paired with the corresponding property spectrum before performing any calculations described hereinabove to enhance the operation and performance of an inferential analyzer by means of measurements by a hard analyzer. Given that the magnitude of the lag may vary as a function of a number of factors relating to the operation of the process, which, referring again to the example of CDU operation, may include changes in feed quality, feed rate, draw rates for the rundown streams, and the temperature profile of the CDU. Therefore, because lag time varies dynamically, a method for dynamically estimating the lag time may be beneficial.

Method (i) may include adjusting predictions from the inferential analyzer by the application of the mathematical relationship in enhancement (g).

Method (j) may include evaluating the difference between pairs of corresponding inferential and measured values, or between results from the aforementioned population-based comparison, to determine if a predicted value or a population of predicted values are valid, where the evaluation is the application of appropriate statistical techniques known to those skilled in the art of statistical analysis, e.g. Statistical Quality Control (SQC) methodologies, where valid predictions are those whose deviation from measured values or populations of measured values is within predetermined tolerance, e.g. the predictions are in statistical control, and where predictions that are not in statistical control are prediction outliers, which also are property outliers, and in some cases may be a concentration outlier.

Method (k) may include updating the model used by inferential analyzer 312 with the addition of data that are relatively recent and therefore are representative of the current conditions, and also by elimination of older data that may be less representative of said conditions, where the model and/or the data include independent variables and/or measurements generated by the hard analyzer 310.

Method (l) may include updating the inferential model by creating and downloading into the inferential analyzer a model, which creation is based on a data set updated by the addition of new sample data for true spectral outliers and/or prediction outliers, and which model updating is performed to increase the dynamic range and/or robustness of predictions made the inferential analyzer by expanding the range of process conditions and/or chemistries represented in said data set used in model creation.

Method (m) may include optionally capturing in a sampling cylinder a process sample that has been identified as a true spectral outlier or a property outlier, where the capturing is accomplished by a sampling system interfaced to the process stream by appropriate means, e.g. a sample fast loop that continuously circulates material from the process stream, and which captured sample is then delivered to the local laboratory for the determination of the property value(s) of interest, which then are used to adjust the outputs of the inferential analyzer in that case in which desired property values are not available from hard analyzer 310.

Method (n) may include performing model updates on the basis of schedule, e.g. about once every 10 days, or about once every 30 days, or about once every 60 days, or about once every 90 days, or on the basis of need, where the need is determined in consideration of factors including but not limited to the frequency and severity (magnitude) of true spectral outliers and/or prediction outliers, the changing of process operation or configuration in a way that results in a substantive change in property spectra, or the cumulative number of outlier samples since the previous model update, where the magnitude of true spectral outliers may be gauged by parameters know to those skilled in the art such as the Mahalanobis distance or spectral residuals.

It should be recognized that methods (h)-(l) generally relate to enhancing the operation and performance of inferential analyzer 312, while methods (a)-(g) generally relate to the mathematical basis for those enhancements.

In a particular embodiment of the instant invention, the hard analyzer 310 is an online gas chromatograph, e.g. a GC8000 manufactured by Yokogawa Electric Corporation, Tokyo, Japan, suitably configured to perform the simulated distillation (simdist) analysis of a single CDU rundown stream, e.g. diesel, in accordance with ASTM D2887, "Standard Test Method for Boiling Range Distribution of Petroleum Fractions by Gas Chromatography." In another embodiment, the gas chromatograph is an ultrafast gas chromatograph (fast GC), e.g. the Calidus micro GC (Falcon Analytical, Lewisburg, W. Va.) capable of performing the simdist analysis of CDU rundown streams with a cycle time of about 3 minutes to 6 minutes per analysis in accordance with ASTM D7798, "Standard Test Method for Boiling Range Distribution of Petroleum Distillates with Final Boding Points up to 538° C. by Ultra Fast Gas Chromatography (UF GC)," where said simdist analysis obtains values for distillation yield temperatures such as $T_{20}$ and $T_{90}$, and where (i) the ultrafast GC performs the simdist analysis on each a plurality of CDU rundown streams, e.g. naphtha, kerosene/jet fuel, diesel, light gasoil, heavy gasoil, and the like; (ii) simdist values for each of the streams are obtained as the result of a single chromatographic analysis, or as the average of results from replicate analyses performed in immediate succession; (iii) the values are used in the aforementioned enhancement of inferential predictions of distillation properties of the streams; (iv) the simdist values for each of the rundown streams are obtained sequentially; and (v) the enhanced inferential predictions are used for process control and optimization between updates of the same by the CQM engine. For example, if simdist properties for each of four CDU rundown streams are determined as the average of three analyses by fast GC, and the total cycle time for each analysis is 5 minutes, then hard analyzer results are available every 4×3×5=60 minutes for the enhancing of inferential predictions on each of the four streams. In particular embodiments, the GC may be configured to implement the conventional ASTM D7798 simdist analysis and/or the UF GC analysis following ASTM D7798. In other embodiments of the invention, the analyzer may be a Fourier Transform Infrared (FTIR) analyzer, a Fourier Transform Near-Infrared (FTNIR) analyzer, a nuclear magnetic resonance (NMR) analyzer, a Raman analyzer, or any combination thereof. Still further, the hard analyzer 310 may be a distillation analyzer configured to implement ASTM D86 "Standard Test Method for Distillation of Petroleum Products at Atmospheric Pressure." However, the illustrative embodiment of FIG. 1A is not intended to be limiting and the dependent variables 40 may comprise any form of measurement detected by an analyzer. For example, the dependent variables may comprise an electrical signal having a particular voltage that is representative of a measurement, a digital value, spectra, and any combination thereof.

In particular embodiments, the gas chromatograph is configured to determine the properties, e.g. specifically, by means of a detailed hydrocarbon analysis (DHA), or generally by the obtaining and evaluation of a chromatogram of the hydrocarbon stream(s) using methods known to those skilled in the art; where the properties include those of gasoline, e.g. octane, percent total aromatics, percent benzene, percent olefins, distillation properties, Reid Vapor Pressure (RVP) and the like, or those of diesel, e.g. cetane number, distillation properties, polynuclear aromatics, polycyclic aromatics, and cold properties such as cloud point, pour point, cold filter plugging point, or those of naphtha, e.g. PIONA and distillation properties; the hard analyzer is optionally one or more online analyzer technologies capable of measuring properties including but not limited to the aforementioned properties of gasoline, diesel, or naphtha by means other than gas chromatography, where the application of the technologies in accordance with established, standardized test methods such as those promulgated by ASTM International may be considered a primary test method; and the qualification of a sample as an outlier is optionally based on a chemometric assessment of the chromatrogram, where the assessment is a multivariate analysis, e.g. one based on PLS, PCR, PCA, and the like.

It should be understood that the plurality of property predictions may be accomplished by means of a corresponding plurality of models (one model per property); or, a single model may be capable of predicting the plurality of properties (one model, many properties). In addition, it should be recognized that reference to distillation yield temperatures, $T_{20}$ and $T_{90}$, i.e., the temperatures at which 20% and 90% of the components in a sample distill off the sample, is non-limiting. Substantially any other distillation yield temperatures may be used, e.g. $T_{50}$, $T_{85}$, $T_{95}$ and $T_{98}$. Additionally, distillation yield temperatures are but one expression of a sample's distillation properties, another being distillation yields determined for certain temperatures, e.g. the percent of a sample that distills by some certain temperature such a 200° C. or 300° C., which sometimes are referred to as E200 and E300 in gasoline. Thus, it should be understood that references to distillation yield temperature, generally or specifically, e.g. $T_{20}$ and $T_{90}$, are non-limiting, but are intended as examples of distillation properties that may be predicted by inferential analyzers or measured by a gas chromatograph. Similarly, the term simulated distillation (simdist) does not apply only to the determination of distillation yield temperatures, but simply denotes the method for determining distillation properties of a hydrocarbon sample by gas chromatography. It should be also understood that references to distillation properties are non-limiting, and that the present invention may be applied beneficially to enhance the inferential prediction of other properties, which may include so-called cold properties such as pour point, cloud point, and cold filter plugging point of diesel.

Turning now to FIG. 1B, a multivariate mathematical model relates the response matrix to the desired property value that generally can be determined in the laboratory in accordance with a primary test method defined by an organization or authority recognized by the industry. Multivariate statistical modeling techniques (common algorithms include Partial Least Squares (PLS) and Principal Component Regression (PCR)) extract information distributed across the entire spectrum for correlation with primary test method results. Application of the resultant calibration models to the measured spectrum of a sample yields inferential values for those properties as shown.

FIG. 2 is a flowchart showing the steps of predicting a property using a model-based soft sensor or model-based hard sensor according to embodiment of the invention. Discrete samples 20 taken from the process 10 are measured by a hard analyzer 310, to yield dependent variables 160. Additionally, independent variables 30 are captured by sensors associated with DCS 320, from the process 10 at a given time t. Using the independent variables 30, the inferential model 80 for the "soft sensor" calculates the predicted values (the inferred dependent variables) 180, which is one or more inferential measurements of the process 10. At 190, the values for the dependent variables 160 are compared with the values for the inferred dependent variables 180. The result of the comparison may be an adjusted inferential prediction and/or an adjustment to the model which is then sent to update the model 80 at 194, and/or to control the process 10 at 196, e.g., via DCS 320. In an alternative embodiment, the comparison result may simply be an updated inferential model 80', which may sent at 194 to replace the model 80.

In certain embodiments of the invention, the analyzer may include a procedure to validate the one or more object variables according to the procedures further discussed herein. Embodiments of the invention are also directed to a procedure to validate the one or more analyzer measurements.

In an embodiment of the invention, the process model or process models may be updated based upon, for example, feedback from a primary measurement. In certain embodiments of the invention, the process model(s) is automatically updated using laboratory data. In certain other embodiments of the invention, the process model(s) is automatically updated using measurements provided by one or more online analyzers. In yet certain other embodiments of the invention, the process model(s) is automatically updated using any combination of laboratory data and measurements provided by one or more online analyzers.

In an embodiment of the invention, any one of or any combination of single factor correlation analysis and multivariate regression analysis may be used to update the process model or correction biases or ratios associated with the estimation of the inferential measurements. According to certain embodiments of the invention, principal factors that control the calculation of specific inferential measurements may be identified and a single factor correlation analysis may be performed on any of these one or more variables. In certain other embodiments of the invention, a quantitative model is established between the independent variables and inferential measurements and the model may be updated using a multivariate regression analysis. In yet other embodiments of the invention a combination of single factor correlation analyses and multivariable regression analysis may be performed to adapt and/or tune the model used to determine one or more inferential measurements.

FIG. 3 is a flowchart showing the steps of determining a property of a process stream according to an embodiment of the invention. The method for determining a property of a process stream 200 comprises calculating an inferential measurement for the property using a model 210, receiving an analyzer measurement of the property 220, evaluating the validity of the inferential measurement 230, evaluating the validity of the analyzer measurement 240, and adjusting the model and/or adjusting the inferential measurement at 250.

In certain embodiments, the method of determining a property of a process stream may comprise the step of adjusting the model using one or more prior valid analyzer measurements when the inferential measurement is invalid and the analyzer measurement is invalid. Further pursuant to this embodiment, the method of determining a property of a process stream may comprise determining whether to use the one or more prior valid analyzer measurements to adjust the model based upon at least one of the age of the one or more prior valid analyzer measurements and the current state of the process in comparison to the state of the process at the time the one or more prior valid analyzer measurements were measured. Moreover, in any of the various embodiments shown and described herein, when both the inferential predictions and the analyzer measurements are determined to be valid, the latter may be used to tune (adjust) the former.

Various embodiments may also discretize the analyzer measurement using, for example, any of the procedures further described herein.

For example, if the age of the one or more prior valid analyzer measurements is too old, then any of the one or more prior valid analyzer measurements may be discarded and not used to adapt or tune the model. According to another example, if the state of the current process is different than the state of the process at the time the one or more prior valid analyzer measurements were measured is different, then any of the one or more prior valid analyzer measurements may likewise be discarded.

EXAMPLES

Table 1 analyzes the effectiveness of the systems and methods of the invention over the more conventional techniques using off-line measurements for process operation and control. The standard error of prediction (SEP) is a measure of the extent of uncertainty associated with the distillation temperatures for the 20 percent ($T_{20}$) and 90 percent ($T_{90}$) recoveries. For example, the distillation temperatures are typically measured in the laboratory by the standard ASTM D-86 method or by a simdist method, e.g. the ASTM D-2887 or D-7798 methods while the latter can also be implemented online using a gas chromatograph, for example.

TABLE 1

| Method | Frequency of Analyzer Measurement | Analysis Type | Use of Online Inferential | SEP, °F. | SEP Relative to 6$^{th}$ Method | Improvement Provided by 6$^{th}$ Method | Benefit of 6th Method per 100,000 barrels per day crude distillation capacity |
|---|---|---|---|---|---|---|---|
| 1 | 24 hours | Lab | No | 5.60 | 4.55 | 78.0% | $758,427 |
| 2 | 8 hours | Lab | No | 4.34 | 3.53 | 71.7% | $539,750 |
| 3 | 24 hours | Lab | Yes | 1.98 | 1.61 | 37.9% | $130,165 |
| 4 | 8 hours | Lab | Yes | 1.80 | 1.46 | 31.7% | $98,925 |
| 5 | 30 minutes | Online | No | 1.54 | 1.37 | 20.1% | $53,801 |
| 6 | 30 minutes | Online | Yes | 1.23 | 1.00 | | |

As shown in Table 1, the mere increase in frequency of measurements results in a reduction in the standard error of prediction and an improvement in process operations. Thus, the frequency provided by on-line analyzers is generally favored over laboratory analysis if the rate of return for the improvement in process operations justifies the installation and support of the on-line analyzer. Notwithstanding the frequency of the analyzer measurement, the standard error of prediction is always improved by integrating the analyzer with an inferential analyzer using a process model that is suited to the type of analysis being performed.

The economic benefit was estimated assuming the value of diesel is $6 greater per barrel than the adjacent naphtha cut and $3 greater per barrel than the adjacent gasoil cut. Thus, the refiner would be motivated to maximize production of diesel while still maintaining the specifications on the T$_{20}$ and T$_{90}$ distillation temperatures.

Upon initial consideration of the economic benefits presented in Table 1, the benefit provided by the 6th method over methods 3 and 4 may not appear to be very compelling. Indeed, the small economic benefit may not offset the cost to install and operate an online analyzer. Given that the performance comparison in Table 1 applies to a CDU operating under nominally steady-state conditions, e.g. when the composition of the crude feed is relatively stable, this result in fact serves to make the point that soft sensors are very effective under such conditions. However, significant profit improvement may be realized by minimizing the duration and severity of disruptions to the crude distillation unit operation resulting from crude switches—i.e., changes between crude feedstocks with different properties. A conventional strategy for reducing disruptions associated with crude switches involves temporarily drawing down or reducing the crude feed rate during the change in feedstocks, and gradually increasing the rate back to a target rate. The availability of property predictions that have both high frequency and high fidelity by Method 6 yield an estimated reduction in throughput losses of approximately $1,280,000 per year per 100,000 barrels per day crude distillation capacity. Compared with conventional techniques, the integrated analyzer system and method of the invention, particularly leveraged by the use of on-line analyzers to enhance inferential predictions, allows adjustment of the latter on time scales sufficiently short to mitigate the impact of crude switchovers in terms of their duration and the disruption they cause to the operation of the CDU and therefore the refinery, and in the immediate example enables the maximizing of diesel production.

Many modifications and other embodiments of the inventions set forth herein will come to mind to one skilled in the art to which these inventions pertain having the benefit of the teachings presented in the foregoing descriptions and the associated drawings. For example, it should be recognized that the "models" shown and described herein not only include those based on multivariate statistical methods, e.g. PCA (principal component analysis), PLS (partial least squares), and MLR (multiple linear regression), but also include RBF (radial basis function), neural networks, models based on first principles, and combinations thereof, along with substantially any model types that may be developed in the future. Similarly, although various exemplary analyzer technologies have been shown and described with respect to the various embodiments herein, it should be recognized that other technologies, such as those based on TDL (tunable diode laser), QCL (quantum cascade laser), and CRD (cavity ring-down) spectroscopy, and combinations thereof, along with any future developed analyzer technology, may be used without departing from the scope of the invention. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A system for determining a property of a fluid process stream, the system comprising:
   a hard analyzer including hardware, configured to generate one or more dependent variables associated with a sample of the fluid process stream, wherein said dependent variables are properties that correspond to composition of the sample, and wherein said dependent variables exclude independent process variables of pressure, temperature, and flow rate;
   a distributed control system (DCS) having a plurality of sensors including at least one temperature sensor, at least one pressure sensor, and at least one flow rate sensor, communicably coupled to the fluid process stream;
   the DCS configured to use said sensors to capture a plurality of independent process variables associated with the fluid process stream, and to use said plurality of independently process variables as process control inputs to control the fluid process stream;

an inferential analyzer including a model of aspects of the fluid process stream, the inferential analyzer being configured to capture from said DCS said plurality of independent process variables associated with the process stream and to use said plurality of independent process variables to generate one or more inferred dependent variables, wherein said plurality of independent process variables are not said dependent variables;

a comparison module configured to generate a comparison of the dependent variables and the inferred dependent variables;

the system being configured to use the comparison to adjust the model; and the DCS configured to use the comparison to adjust one or more parameters of the fluid process stream.

2. The system of claim 1, wherein the system is configured to control the process stream by adjusting values for the inferred dependent variables.

3. The system of claim 1, further comprising a cognitive quality manager (CQM) configured to use the comparison to adjust the model.

4. The system of claim 1, further comprising a process optimizer configured to use the comparison to control the process stream.

5. The system of claim 4, further comprising a process control system operatively engaged with the process optimizer, the process control system configured to adjust one or more parameters of the process stream in response to receipt of instructions from the process optimizer.

6. The system of claim 1, wherein the inferential analyzer is configured to capture the plurality of independent process variables over a discrete interval.

7. The system of claim 6, wherein the discrete interval is at most about 240 minutes.

8. The system of claim 7, wherein the discrete interval is at most about 180 minutes.

9. The system of claim 8, wherein the discrete interval is at most about 120 minutes.

10. The system of claim 9, wherein the discrete interval is at most about 90 minutes.

11. The system of claim 10, wherein the discrete interval is at most about 60 minutes.

12. The system of claim 1, wherein the model comprises at least one of a statistical model and a statistical multivariate model.

13. The system of claim 1, wherein at least one of the independent process variables, the dependent variables, and the inferred dependent variables is discretized.

14. The system of claim 1, wherein the independent process variables include one or more of temperature, pressure, rate of addition or consumption of a catalyst or reagent, flow rate, the input or output of thermal energy to the process, refractive index, conductivity, viscosity, opacity, pH, density, intensity responses measured by photometric or spectrometric devices at particular wavelengths or frequencies, and combinations thereof.

15. The system of claim 1, being further configured to aggregate the independent process variables into a property spectrum.

16. The system of claim 15, wherein the system is configured to use the property spectrum to update the model.

17. The system of claim 1, wherein the comparison includes a validation of at least one of the independent process variables, the dependent variables, and the inferred dependent variables.

18. The system of claim 17, being configured to adjust the model and/or control the process stream once the dependent variables are validated.

19. The system of claim 18, being configured to determine whether to use the validated dependent variables to adjust the model based upon at least one of an age of the validated dependent variables and a current state of the process as compared to a state of the process at the time the validated dependent variable was measured.

20. The system of claim 17, wherein the comparison module is configured to generate the comparison using a statistical multivariate procedure.

21. The system of claim 17, wherein the comparison module is configured to generate the comparison using a procedure selected from the group consisting of:
(a) a multivariate method to determine whether the sample spectrum belongs to a population of sample spectra which includes a calibration sample set;
(b) multivariate method to classify any spectral outlier according to cause;
(c) replacing any false independent variable within the outlier sample spectrum;
(d) determining whether any outlier condition is due to a particular sensor by comparing sensor output to a baseline;
(e) correcting the outlier condition by replacement of a false independent variable with a model value;
(f) using averaging, regression, a damping function, or a vector-based algorithm, to provide a mathematical relationship between the inferred dependent variables and the dependent variables, which mathematical relationship is then applied to subsequent inferential predictions to produce a corrected inferential value;
(g) estimating a lag time of the dependent variables relative to the inferred dependent variables;
(h) applying a statistical analysis to the dependent variables and the inferred dependent variables;
(i) updating the model with the addition of recent data to and the elimination of older data from the data set used in creation of the model;
(j) updating the model by adding sample data for spectral outliers and/or prediction outliers to the data set used in creation of the model;
(k) capturing a sample that has been identified as a spectral outlier or a property outlier, and using it to adjust outputs of the inferential analyzer;
(l) performing model updates on the basis of schedule;
(m) performing model updates on the basis of need as determined by factors including frequency, severity of spectral outliers and/or prediction outliers, and/or changing of process operation or configuration;
(n) applying a goodness of fit test procedure; and combinations thereof.

22. The system of claim 1, wherein the hard analyzer comprises a gas chromatograph configured to generate the dependent variables by capturing and evaluating a chromatogram of a sample of the process stream.

23. The system of claim 1, wherein the hard analyzer is at least one of a gas chromatograph (GC), a fast GC, an ultrafast GC, a Fourier Transform Infrared (FTIR) analyzer, a Fourier Transform Near-Infrared (FTNIR) analyzer, a nuclear magnetic resonance (NMR) analyzer, a Raman analyzer, a flash point analyzer, a distillation property analyzer, a cloud point analyzer, a freezing point analyzer, a cold filter plugging point analyzer, a pour point analyzer, and a combination thereof.

24. The system of claim 1, wherein the dependent variables include one or more of octane, percent total aromatics, percent benzene, percent olefins, distillation properties, Reid Vapor Pressure (RVP), cetane number, distillation properties, polynuclear aromatics, polycyclic aromatics, cloud point, pour point, cold filter plugging point, PIONA, PONA, distillation properties, and combinations thereof.

25. The system of claim 1, wherein the inferential analyzer is configured to generate the one or more inferred dependent variables in real time, and the hard analyzer is an online analyzer that generates dependent variables with a frequency that is lower than the frequency with which inferred dependent variables are generated, and wherein the comparison is used to adjust the model and/or to control the process stream in real time.

26. A method for determining a property of a process stream, the method comprising:
generating, with a hard analyzer including hardware, one or more dependent variables associated with a sample of the process stream, wherein said dependent variables are properties that correspond to composition of the sample, and wherein said dependent variables exclude independent process variables of pressure, temperature, and flow rate;
communicably coupling a distributed control system (DCS) having a plurality of sensors including at least one temperature sensor, at least one pressure sensor, and at least one flow rate sensor, to the fluid process stream;
using the DCS and the sensors to capture a plurality of independent process variables associated with the fluid process stream, and using said plurality of independent process variables as process control inputs to control the fluid process stream;
capturing from the DCS, with an inferential analyzer including a model of aspects of the process stream, said plurality of independent process variables associated with the process stream and using said plurality of independent process variables to generate one or more inferred dependent variables, wherein said plurality of independent process variables are not said dependent variables;
generating, with a comparison module, a comparison of the dependent variables and the inferred dependent variables;
using the comparison to adjust the model; and
with the DCS, using the comparison to adjust one or more parameters of the fluid process stream.

27. The method of claim 26, wherein said using the comparison further comprises using the comparison to control the process stream by adjusting values for the inferred dependent variables.

28. The method of claim 26, further comprising using a cognitive quality manager (CQM) to adjust the model.

29. The method of claim 26, further comprising using a process optimizer to control the process stream.

30. The method of claim 29, further comprising using a process control system operatively engaged with the process optimizer, to adjust one or more parameters of the process stream in response to receipt of instructions from the process optimizer.

31. The method of claim 26, further comprising using the inferential analyzer to capture the one or more independent process variables over a discrete interval.

32. The method of claim 31, wherein the discrete interval is at most about 240 minutes.

33. The method of claim 32, wherein the discrete interval is at most about 180 minutes.

34. The method of claim 33, wherein the discrete interval is at most about 120 minutes.

35. The method of claim 34, wherein the discrete interval is at most about 90 minutes.

36. The method of claim 35, wherein the discrete interval is at most about 60 minutes.

37. The method of claim 26, further comprising the inferential analyzer using a model in the form of at least one of a statistical model and a statistical multivariate model.

38. The method of claim 26, further comprising discretizing at least one of the independent process variables, the dependent variables, and the inferred dependent variables.

39. The method of claim 26, wherein the independent process variables include one or more of temperature, pressure, rate of addition or consumption of a catalyst or reagent, flow rate, the input or output of thermal energy to the process, refractive index, conductivity, viscosity, opacity, pH, density, intensity responses measured by photometric or spectrometric devices at particular wavelengths or frequencies, and combinations thereof.

40. The method of claim 26, further comprising aggregating the independent process variables into a property spectrum.

41. The method of claim 40, further comprising using the property spectrum to update the model.

42. The method of claim 26, wherein said generating a comparison comprises validating at least one of the independent process variables, the dependent variables, and the inferred dependent variables.

43. The method of claim 42, comprising adjusting the model and/or controlling the process stream once the dependent variables are validated.

44. The method of claim 43, comprising determining whether to use the validated dependent variables to adjust the model based upon at least one of an age of the validated dependent variables and a current state of the process as compared to a state of the process at the time the validated dependent variable was measured.

45. The method of claim 42, comprising generating the comparison using a statistical multivariate procedure.

46. The method of claim 42, comprising generating the comparison using a procedure selected from the group consisting of:
(a) a multivariate method to determine whether the sample spectrum belongs to a population of sample spectra which includes a calibration sample set;
(b) multivariate method to classify any spectral outlier according to cause;
(c) replacing any false independent variable within in the sample spectrum;
(d) determining whether any outlier condition is due to a particular sensor by comparing sensor output to a baseline;
(e) correcting the outlier condition by replacement with a model value;
(f) using averaging, regression, a damping function, or a vector-based algorithm, to provide a mathematical relationship between the inferred dependent variables and the dependent variables, which mathematical relationship is then applied to subsequent inferential predictions to produce a corrected inferential value;
(g) estimating a lag time of the dependent variables relative to the inferred dependent variables;
(h) applying a statistical analysis to the dependent variables and the inferred dependent variables;

(i) updating the model with the addition of recent data to and the elimination of older data from the data set used in creation of the model;

(j) updating the model by adding sample data for spectral outliers and/or prediction outliers to the data set used in creation of the model;

(k) capturing a sample that has been identified as a spectral outlier or a property outlier, and using it to adjust outputs of the inferential analyzer;

(l) performing model updates on the basis of schedule;

(m) performing model updates on the basis of need as determined by factors including frequency, severity of spectral outliers and/or prediction outliers, and/or changing of process operation or configuration;

(n) applying a goodness of fit test procedure; and combinations thereof.

47. The method of claim 26, wherein the hard analyzer comprises a gas chromatograph configured to generate the dependent variables by capturing and evaluating a chromatogram of a sample of the process stream.

48. The method of claim 26, wherein the hard analyzer is at least one of a: gas chromatograph (GC), a fast GC, an ultrafast GC, a Fourier Transform Infrared (FTIR) analyzer, a Fourier Transform Near-Infrared (FTNIR) analyzer, a nuclear magnetic resonance (NMR) analyzer, a Raman analyzer, a flash point analyzer, a distillation property analyzer, a cloud point analyzer, a freezing point analyzer, a cold filter plugging point analyzer, a pour point analyzer, and a combination thereof.

49. The method of claim 26, wherein the dependent variables include one or more of octane, percent total aromatics, percent benzene, percent olefins, distillation properties, Reid Vapor Pressure (RVP), cetane number, distillation properties, polynuclear aromatics, polycyclic aromatics, cloud point, pour point, cold filter plugging point, PIONA, PONA, distillation properties, and combinations thereof.

50. The method of claim 26, wherein said capturing and using is effected using an on-line hard analyzer in real time, and the comparison is used to adjust the model and/or to control the process stream in real time.

* * * * *